United States Patent
Lee et al.

(10) Patent No.: US 11,232,839 B1
(45) Date of Patent: Jan. 25, 2022

(54) ERASING METHOD FOR 3D NAND FLASH MEMORY

(71) Applicant: Yangtze Memory Technologies Co., Ltd., Hubei (CN)

(72) Inventors: Changhyun Lee, Hubei (CN); Chao Zhang, Hubei (CN); Haibo Li, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/062,053

(22) Filed: Oct. 2, 2020

Related U.S. Application Data

(63) Continuation of application No. PCT/CN2020/111689, filed on Aug. 27, 2020.

(51) Int. Cl.
| | | |
|---|---|---|
| *G11C 16/16* | (2006.01) | |
| *G11C 16/04* | (2006.01) | |
| *H01L 27/11582* | (2017.01) | |
| *H01L 27/11556* | (2017.01) | |

(52) U.S. Cl.
CPC .......... *G11C 16/16* (2013.01); *G11C 16/0483* (2013.01); *H01L 27/11556* (2013.01); *H01L 27/11582* (2013.01)

(58) Field of Classification Search
CPC .................................................. G11C 16/16
USPC .................................................. 365/185.29
See application file for complete search history.

(56) References Cited

U.S. PATENT DOCUMENTS

| | | |
|---|---|---|
| 8,891,308 B1 | 11/2014 | Ou et al. |
| 9,318,209 B1 | 4/2016 | Huynh et al. |
| 10,644,018 B2 | 5/2020 | Lee et al. |
| 2011/0199825 A1 | 8/2011 | Hao et al. |
| 2016/0111164 A1 | 4/2016 | Chen et al. |
| 2019/0066797 A1* | 2/2019 | Yip .................... G11C 16/3445 |
| 2019/0102104 A1 | 4/2019 | Righetti et al. |
| 2019/0378849 A1 | 12/2019 | Tao et al. |

FOREIGN PATENT DOCUMENTS

TW        201944541 A        11/2019

OTHER PUBLICATIONS

International Search Report of the International Searching Authority directed to related International Patent Application No. PCT/CN2020/111689, dated May 31, 2021; 5 pages.

* cited by examiner

*Primary Examiner* — Jason Lappas
(74) *Attorney, Agent, or Firm* — Sterne, Kessler, Goldstein & Fox P.L.L.C.

(57) ABSTRACT

Embodiments of erasing methods for a three-dimensional (3D) memory device are disclosed. The 3D memory device includes multiple decks vertically stacked over a substrate, wherein each deck includes a plurality of memory cells. The erasing method includes checking states of the plurality of memory cells of an erase-inhibit deck and preparing the erase-inhibit deck according to the states of the plurality of memory cells. The erasing method also includes applying an erase voltage at an array common source, applying a hold-release voltage on unselected word lines of the erase-inhibit deck, and applying a low voltage on selected word lines of a target deck.

20 Claims, 11 Drawing Sheets

US 11,232,839 B1

ERASING METHOD FOR 3D NAND FLASH MEMORY

CROSS-REFERENCE TO RELATED APPLICATIONS AND INCORPORATION BY REFERENCE

This application claims priority to PCT/CN2020/111689 filed on Aug. 27, 2020, which is incorporated herein by reference in its entirety.

TECHNICAL FIELD

The present disclosure generally relates to the field of semiconductor technology, and more particularly, to an erasing method for a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. To further increase storage density, multiple decks can be stacked vertically, where in each deck there are many vertically stacked memory cells. To read, write and erase efficiently in a 3D NAND flash memory with multiple decks, each deck can be treated as a separate memory block, i.e., each deck can be erased independently from the other decks. However, the erase operation of a selected deck can be affected by the neighboring decks that are connected in serial. For example, when erasing a top deck, depending on the data stored in other neighboring decks, charge carriers for the erase operation may not be able to transport to the selected deck. Accordingly, the selected deck may have erase-fail bits due to the influence from neighboring decks. Therefore, a need exists for a method to erase a selected deck in a 3D NAND memory so that each memory cell in the selected deck can be reset to the erased state accurately and efficiently.

BRIEF SUMMARY

Embodiments of a method for an erase operation in a three-dimensional (3D) memory device with multiple decks is described in the present disclosure.

One aspect of the present disclosure provides erasing methods for a three-dimensional (3D) memory device, that includes multiple decks vertically stacked over a substrate, where each deck includes a plurality of memory cells. The erasing method includes checking states of the plurality of memory cells of an erase-inhibit deck and preparing the erase-inhibit deck according to the states of the plurality of memory cells. The erasing method also includes applying an erase voltage at an array common source or an array cell well-body, applying a hold-release voltage on unselected word lines of the erase-inhibit deck, and applying a low voltage on selected word lines of a target deck.

In some embodiments, preparing the erase-inhibit deck includes applying a first preparation voltage on the unselected word lines of the erase-inhibit deck when the plurality of memory cells of the erase-inhibit deck are in programmed states.

In some embodiments, applying the first preparation voltage includes applying a voltage between about 0 V and about 1 V.

In some embodiments, applying the first preparation voltage includes applying 0 V.

In some embodiments, preparing the erase-inhibit deck includes applying a second preparation voltage on the unselected word lines of the erase-inhibit deck when the plurality of memory cells of the erase-inhibit deck are in erased states. The second preparation voltage is larger than the first preparation voltage.

In some embodiments, applying the second preparation voltage includes applying a voltage between about 1 V and about 7 V.

In some embodiments, preparing the erase-inhibit deck includes applying a first preparation voltage on a first subset of the unselected word lines of the erase-inhibit deck when a first subset of the plurality of memory cells having the first subset of the unselected word lines are in programmed states, and applying a second preparation voltage on a second subset of the unselected word lines of the erase-inhibit deck when a second subset of the plurality of memory cells having the second subset of the unselected word lines are in erased states. The second preparation voltage is larger than the first preparation voltage.

In some embodiments, the second subset of the plurality of memory cells includes at least two neighboring memory cells.

In some embodiments, preparing the erase-inhibit deck includes applying a first preparation voltage and a second preparation voltage that is larger than the first preparation voltage, on the unselected word lines of the erase-inhibit deck randomly, when a first subset of the plurality of memory cells in the erase-inhibit deck are in programmed states and a second subset of the plurality of memory cells in the erase-inhibit deck are in erased states.

In some embodiments, applying the low voltage comprises applying a voltage in a range between about 0 V and about 1 V.

In some embodiments, applying the low voltage comprises applying a voltage of 0 V.

In some embodiments, applying the hold-release voltage includes applying a voltage of 0 V, and subsequently removing the voltage of 0 V and any external bias.

In some embodiments, applying the erase voltage includes applying a voltage in a range between about 15 V to about 25 V.

In some embodiments, applying the erase voltage includes applying about 20 V.

In some embodiments, the erasing method also includes applying the erase voltage at bit lines of the target deck.

In some embodiments, the erasing method further includes applying the hold-release voltage on the selected word lines of the target deck prior to applying the low voltage on the selected word lines of the target deck.

In some embodiments, the erasing method further includes applying the hold-release voltage on unselected word lines of a bottom deck, and applying the low voltage on selected word lines of a top deck. The top deck is vertically stacked on the bottom deck over the substrate.

In some embodiments, the erasing method further includes applying the hold-release voltage on unselected word lines of a top deck and a bottom deck, and applying the low voltage on selected word lines of a middle deck. The top deck is vertically stacked on the middle deck and the middle deck is vertically stacked on the bottom deck over the substrate. In some embodiments, the erasing method further includes applying the erase voltage at bit lines of the top deck.

Another aspect of the present disclosure provides a three-dimensional (3D) memory device having multiple decks vertically stacked over a substrate. Each deck includes a film stack of alternating conductive and dielectric layers, and a plurality of memory strings penetrating through the film stack, where each memory string includes a plurality of memory cells. The 3D memory device also includes a conductive plug disposed between adjacent decks, electrically connecting the plurality of memory strings between the adjacent decks. The multiple decks of the 3D memory device includes a target deck and an erase-inhibit deck. The 3D memory device is configured to erase the target deck by the following steps: checking states of the plurality of memory cells of the erase-inhibit deck, preparing the erase-inhibit deck according to the states of the plurality of memory cells of the erase-inhibit deck, applying an erase voltage at an array common source or an array cell well-body, applying a hold-release voltage on unselected word lines of the erase-inhibit deck, and applying a low voltage on selected word lines of the target deck Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
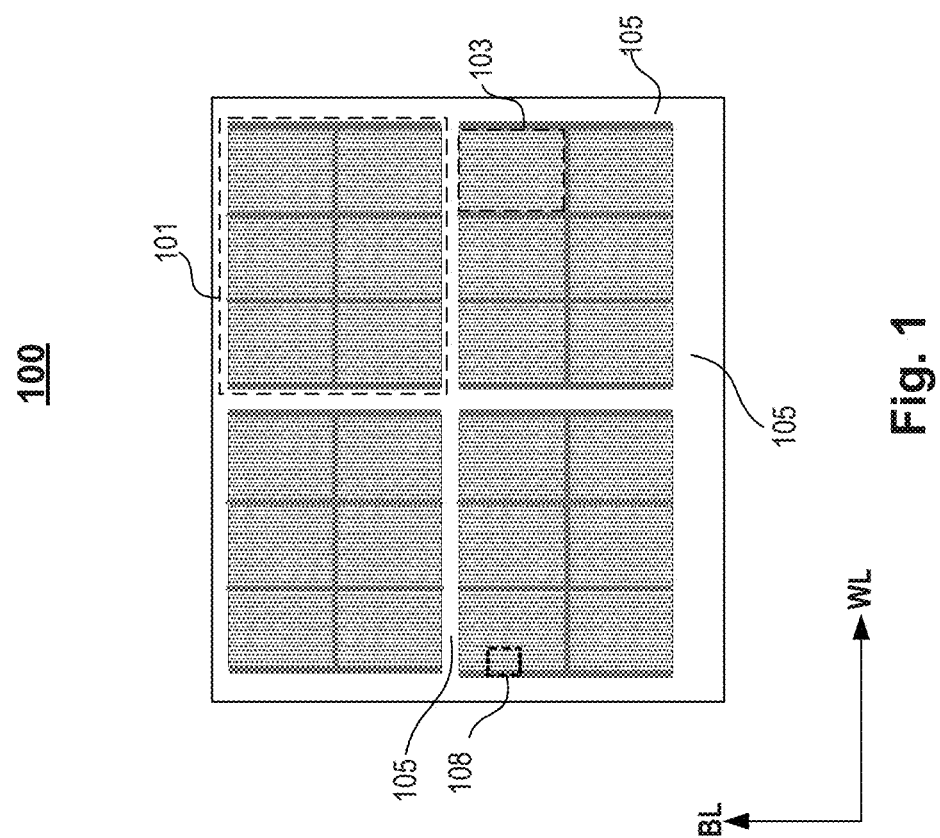
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
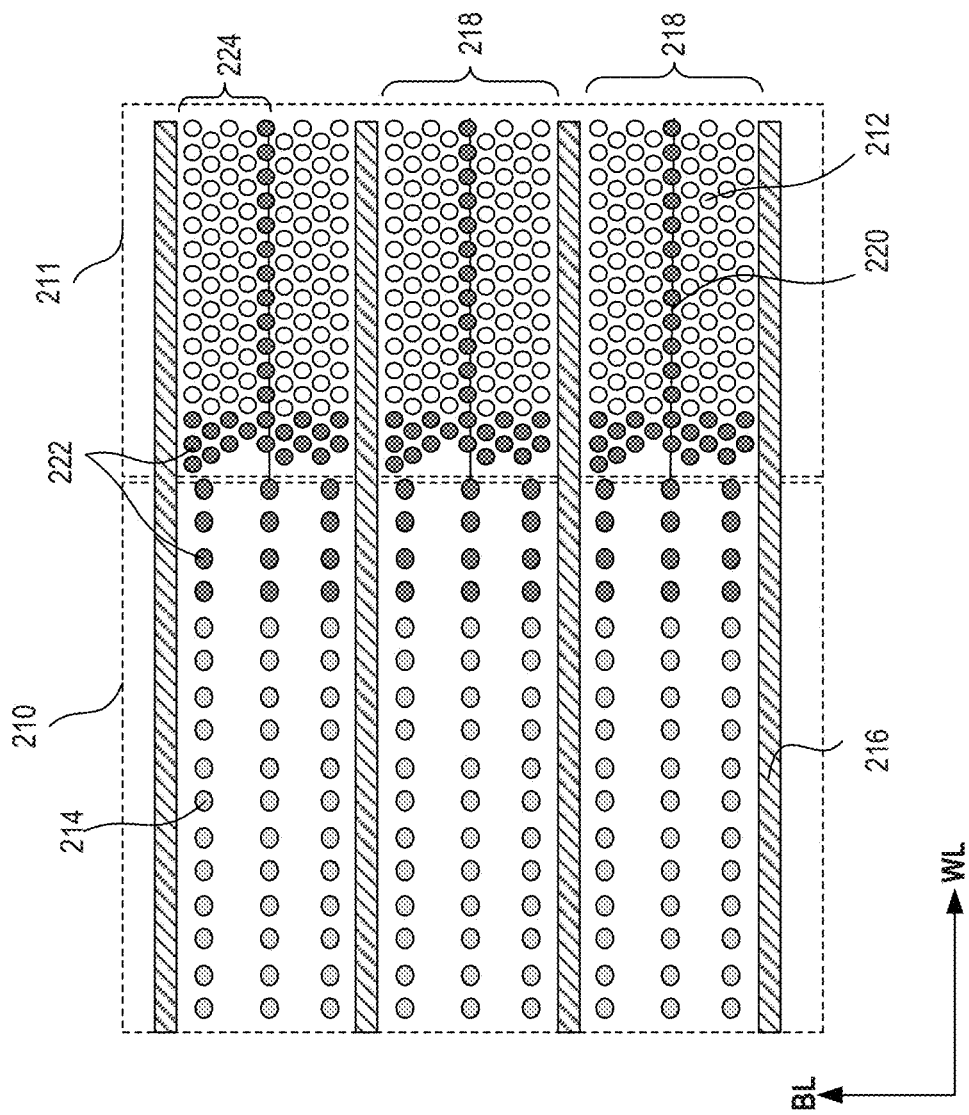
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact (e.g., array common source) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
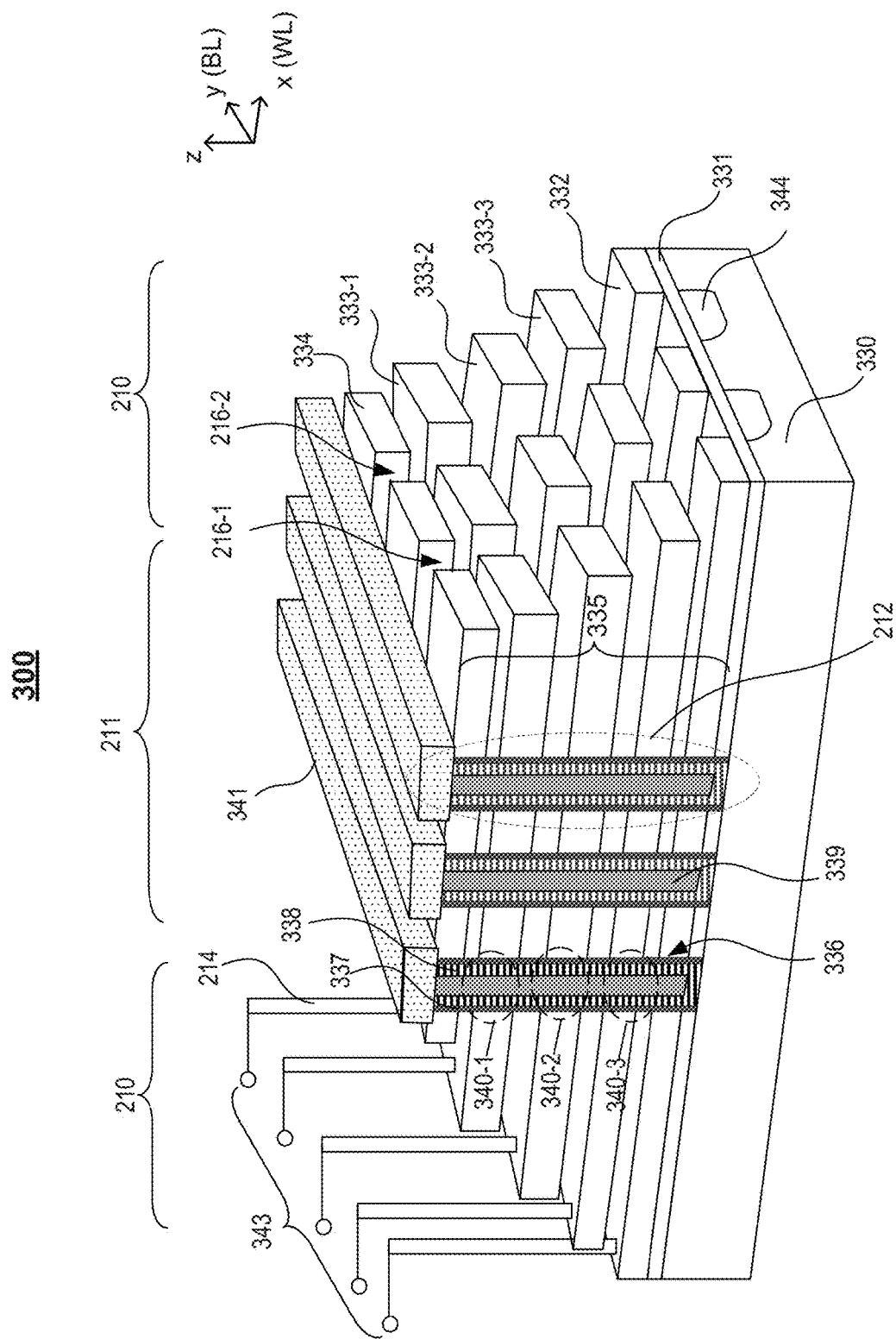
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. A portion of the channel layer 338 underneath the control gate 333 is also referred to as the channel of the memory cell 340. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

Figure 4:
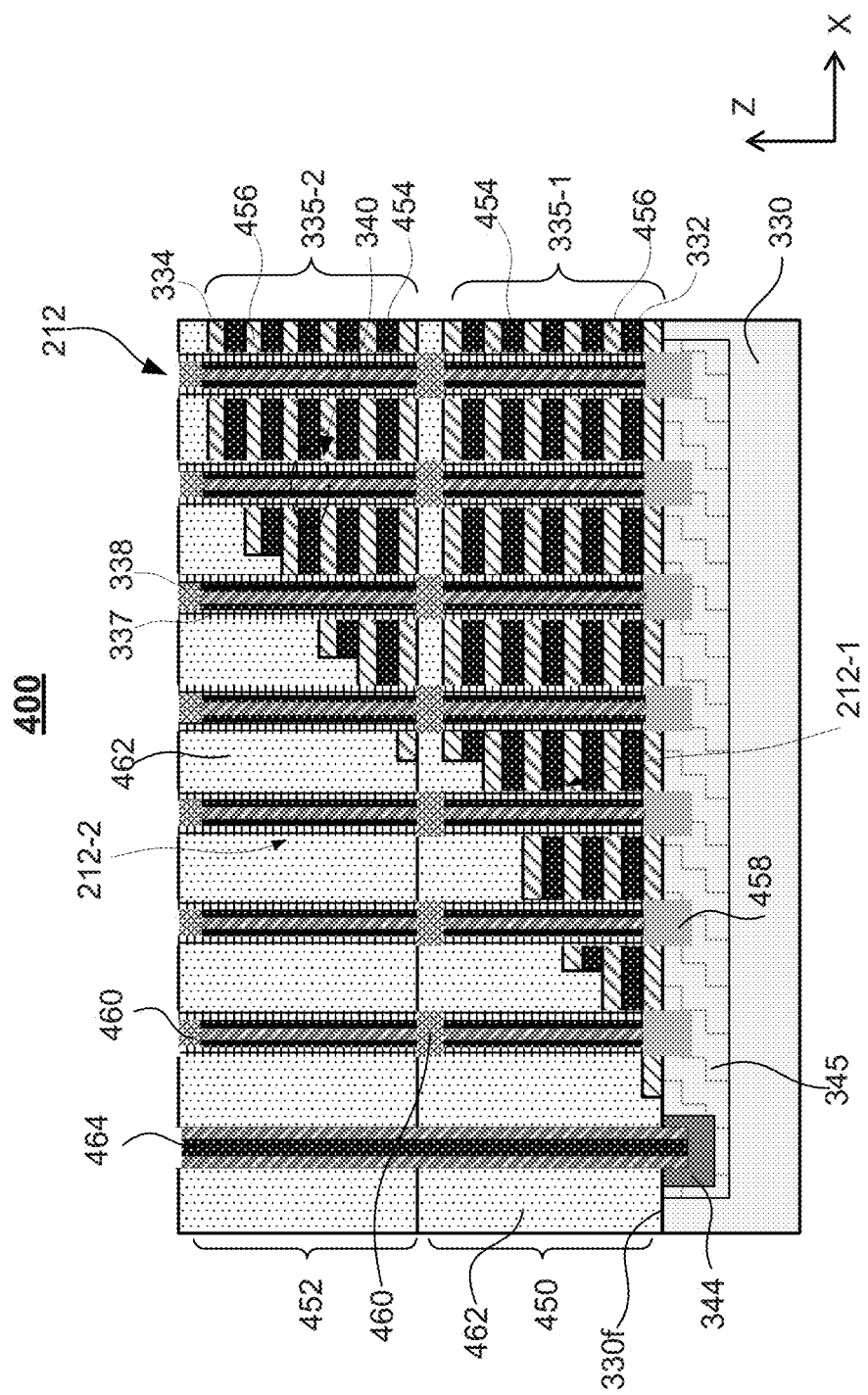
FIG. 4 illustrates a cross-sectional view of 3D memory device with multiple decks, according to some embodiments of the present disclosure.

FIG. 4 illustrates a cross-sectional view (along X direction) of a 3D memory device 400 with multiple decks, according to some embodiments of the present disclosure. As an example in FIG. 4, the 3D memory device 400 has two decks, i.e., a bottom deck 450 and a top deck 452 stacked vertically on top of the bottom deck 450. The bottom deck 450 and the top deck 452 are disposed on a substrate (e.g., the substrate 330). Substrate 330 can provide a platform for the 3D memory device 400, which is formed on a front (e.g., top) surface 330f of the substrate 330. And subsequent structures are formed in a vertical direction (e.g., orthogonal to the front surface of substrate 330). In FIG. 4, the X and Y directions are along a plane parallel to the front and back surfaces of substrate 330, while the Z direction is in a direction orthogonal to the front and back surfaces of substrate 330. Here, the X and Y directions are parallel to the respective word line (WL) and bit line (BL) directions shown in FIGS. 1-3.

In some embodiments, the substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

In some embodiments, the bottom deck 450 and the top deck 452 include bottom film stack 335-1 and top film stack 335-2, respectively. The bottom film stack 335-1 and the top film stack 335-2 can be similar to the film stack 335 in FIG. 3, and include a plurality of conductor layers 454 and dielectric layers 456. The conductor layers 454 and the dielectric layers 456 in the bottom film stack 335-1 and top film stack 335-2 alternate in the vertical direction. In other words, except the one at the bottom of the bottom film stack 335-1 and the one at the top of the top film stack 335-2, each conductor layer 454 can be sandwiched by two dielectric layers 456 on both sides, and each dielectric layer 456 can be sandwiched by two conductor layers 454 on both sides. The conductor layers 454 can each have the same thickness or have different thicknesses. Similarly, the dielectric layers 456 can each have the same thickness or have different thicknesses. In some embodiments, the bottom film stack 335-1 and the top film stack 335-2 include different number of conductor layers 454 and/or dielectric layers 456 and/or include different materials and/or thicknesses. The conductor layers 454 can include conductor materials such as W, Co, Cu, Al, Ti, Ta, TiN, TaN, Ni, doped silicon, silicides (e.g., NiSix, WSix, CoSix, TiSix) or any combination thereof. The dielectric layers 456 can include dielectric materials such as silicon oxide, silicon nitride, silicon oxynitride, or any combination thereof.

In some embodiments, the bottom deck 450 and the top deck 452 can also include memory cells of a 3D NAND memory (e.g., the memory cell 340 in FIG. 3) where the memory cells 340 can be stacked vertically as memory strings (e.g, the memory strings 212 in FIG. 3). As shown in FIG. 4, the memory string 212 extends through the top film stack 335-2 and the bottom film stack 335-1 and includes a bottom vertical structure 212-1 and a top vertical structure 212-2. Each memory string 212 can include the channel layer 338 and the memory film 337 (similar to those in FIG. 3). In some embodiments, the channel layer 338 includes silicon, such as amorphous silicon, polysilicon, or single crystalline silicon. In some embodiments, the memory film 337 is a composite layer including a tunneling layer, a storage layer (also known as "charge trap/storage layer"), and a blocking layer. Each memory string 212 can have a cylinder shape (e.g., a pillar shape). The channel layer 338, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide).

In some embodiments, the conductor layers 454 in the bottom film stack 335-1 and the top film stack 335-2 can act as the control gates (e.g., the control gates 333 in FIG. 3) for the memory cells 340. As shown in FIG. 4, the memory string 212 can include the lower select gate 332 (e.g., a source select gate) at a lower end (i.e., a source terminal) of the memory string 212 in the bottom deck 450. The memory string 212 can also include the top select gate 334 (e.g., a drain select gate) at an upper end (i.e. a drain terminal) of the memory string 212 in the top deck 452. As used herein, the "upper end" of a component (e.g., memory string 212) is the end further away from the substrate 330 in the vertical direction, and the "lower end" of the component (e.g., memory string 212) is the end closer to the substrate 330 in the vertical direction. As shown in FIG. 4, for each memory string 212, the drain select gate 334 can be above the source select gate 332. In some embodiments, the lower select gate 332 and top select gate 334 include conductor materials such as W, Co, Cu, Al, doped silicon, silicides, or any combination thereof.

In some embodiments, the 3D memory device 400 includes an epitaxial layer 458 on an lower end of the channel layer 338 of the memory string 212 in the bottom deck 450. The epitaxial layer 458 can include a semiconductor material, such as silicon. The epitaxial layer 458 can be epitaxially grown from the substrate 330. For each memory string 212, the epitaxial layer 458 is referred to herein as an "epitaxial plug." The epitaxial plug 458 can contact both the channel layer 338 and an array cell wellbody 345 in the substrate 330. The epitaxial plug 458 can function as the channel of the lower selective gate 332 at the lower end of memory string 212. In some embodiments, the array cell well-body 345 can be p-type doped, while the doped source line region 344 can be n-type doped.

In some embodiments, the 3D memory device 400 includes an insulating layer 462 in both the top deck 452 and the bottom deck 450. The insulating layer 462 surrounds the memory strings 212 and provide isolation between neighboring memory strings 212. The insulating layer 462 can include insulating materials, for example, silicon oxide, silicon nitride, silicon oxynitride, doped silicon oxide (such as F—, C—, N— or H— doped oxides), tetraethoxysilane (TEOS), polyimide, spin-on-glass (SOG), low-k dielectric material such as porous SiCOH, silsesquioxan (SSQ), or any combination thereof.

In some embodiments, the top vertical structure 212-2 of the memory string 212 in the top deck 452 can be substantially aligned with the bottom vertical structure 212-1 in the bottom deck 450. In some embodiments, each memory string 212 includes a conductive plug 460 in between the top vertical structure 212-2 and the bottom vertical structure 212-1. The conductive plug 460 can provide electric connection between the channel layer 338 located in the bottom vertical structure 212-1 and the channel layer 338 located in the top vertical structure 212-2 such that the top vertical structure 212-2 and the bottom vertical structure 212-1 can form the memory string 212 for the 3D memory device 400 of two decks, where the memory string 212 can provide similar memory functions as the memory string 212 in a 3D memory device with a single deck. In some embodiments, the conductive plug 460 includes polysilicon.

According to some embodiments, the 3D memory device 400 further includes a conductive recess 461 on a top portion of the memory string 212 in the top deck 452. In some embodiments, the conductive recess 461 includes polysilicon.

In some embodiments, the film stack 335-1 and film stack 335-2 each includes a staircase structure where each of the conductive layer 454 terminate at a different length in the horizontal 'X' direction. The staircase structure allows for electric connection between the word line and the conductive layer 454.

In some embodiments, the 3D memory device 400 includes an array common source (ACS) 464 penetrating vertically through the top deck 452 and the bottom deck 450 into the substrate 330. The ACS 464 can be electrically connected to the doped source line region 344. Accordingly, the ACS 464 can be electrically connected to the lower end (i.e., the source terminal) of the memory string 212 if the lower select gate 332 is switched on.

In some embodiments, the ACS 464 includes a conductive core that can be a metal or metal alloy such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. The arrangement of the array common source 464 in FIG. 4 is shown for illustration purpose. In some embodiments, the ACS 464 can be extended along the X-direction (parallel to word lines shown in FIGS. 1-3). In some embodiments, the ACS 464 can be formed on a back side of the substrate 330, opposite to the front surface.

The 3D memory device 400 can also include bit line contacts (not shown in FIG. 4) formed on a top end (i.e., a drain terminal) of the memory strings 212 in the top deck 452 to provide individual access to the channel layers 338 of the memory strings 212 in the top deck 452 and bottom deck 450. The conductive lines connected with the conductive layers 454 and the bit line contacts form word lines and bit lines of the 3D memory device 400, respectively. Typically the word lines and bit lines are laid perpendicular to each other (e.g., in rows and columns, respectively), forming an "array" of the memory.

It is noted that a 3D memory device with only two decks are described here for illustration purpose. Similar structures and functions can be extended to a 3D memory device with more than two decks.

Figure 5:
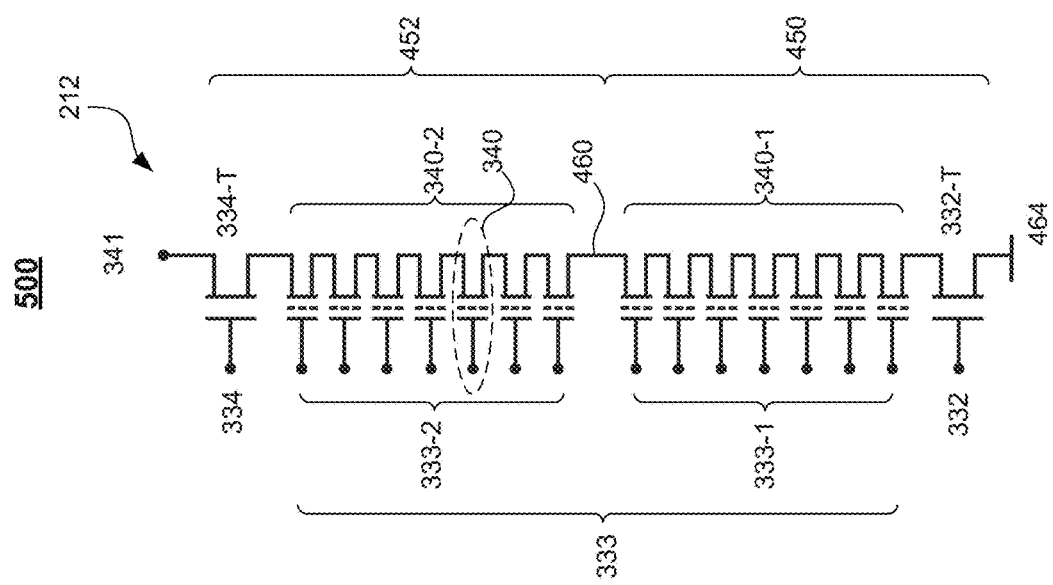
FIG. 5 illustrates a schematic circuit diagram of a 3D memory device with multiple decks, according to some embodiments of the present disclosure.

FIG. 5 shows a schematic circuit diagram of a 3D memory device 500 with multiple decks, according to some embodiments of the present disclosure. As an example, the 3D memory device 500 includes two decks, e.g., the top deck 452 and the bottom deck 450. The 3D memory device 500 also includes the memory string 212 having a plurality of stacked memory cells 340, where the memory cells 340-1 are in the bottom deck 450 and the memory cells 340-2 are in the top deck 452. The 3D memory device 500 also includes a conductive plug 460 in between the top deck 452 and the bottom deck 450. Accordingly, in the 3D memory device 500 with multiple decks, the memory cells 340-2 in the top deck 452 can be electrically connected with the memory cells 340-1 in the bottom deck 450 to form the memory string 212. The memory string 212 further includes at least one field effect transistor (e.g., MOSFET) at each end, which is controlled by the lower select gate (LSG) 332 and the top select gate (TSG) 334, respectively. And the two respective transistors are referred to as a lower select transistor 332-T and a top select transistor 334-T. The stacked memory cells 340 can be controlled by the control gates 333, where the control gates 333 are connected to word lines (not shown) of the 3D memory device 500. The drain terminal of the top select transistor 334-T can be connected to the bit line 341, and the source terminal of the lower select transistor 332-T can be connected to the doped source line region 344 (see FIG. 4), from where the ACS 464 can be formed. The ACS 464 can be shared by the memory strings 212 in an entire memory block, and is also referred to as the common source line.

In a NAND memory, read and write operations can be performed in a memory page, which includes memory cells sharing the same word line. Each memory cell can be in an erased state or a programmed state. Initially, all memory cells in a block can be reset to the erased state as logic "1" by implementing a negative voltage difference between the control gates 333 and source terminals of the memory cells (e.g., lower terminal closer to the substrate 330) such that all electronic charges stored in the memory cells can be removed. In some embodiments, electrons stored in the memory film can be expelled to the channel layer through Flower-Nordheim (F-N) tunneling, and thereby changing a threshold voltage $V_{th}$ of the memory cell 340. In some embodiments, the ACS 464 can be grounded at zero voltage (0 V) and a negative voltage can be applied on the control gates 333. In some embodiments, a positive voltage can be applied at the ACS 464 and the control gates 333 can be grounded at 0 V. At the erased state, the threshold voltage $V_{th}$ of the memory cells 340 can be reset to a lowest value, e.g., an erased state threshold voltage Val erase, and the corresponding current flowing through the memory cells 340 between the source terminal (e.g., terminal closer to the substrate 330) and the drain terminal (e.g., terminal closer to the bit lines 341) can be at the highest level.

Figure 6:
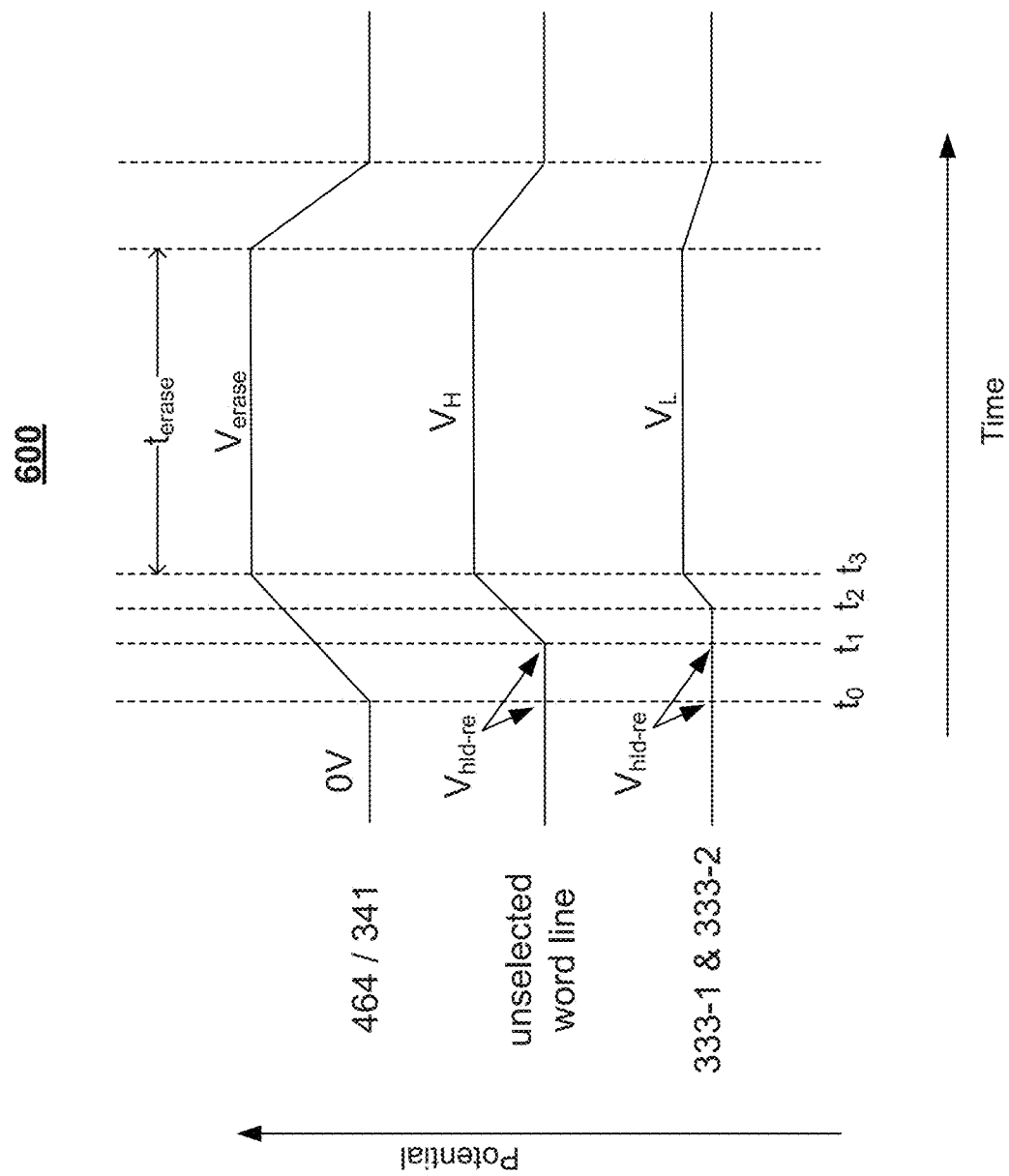
FIGS. 6-8 illustrate wave form diagrams of erase operations for 3D memory devices with multiple decks, according to some embodiments of the present disclosure.

FIG. 6 shows a wave form for an erase operation 600, according to some embodiments of the present disclosure. The erase operation 600 can be performed for all the memory cells in a memory block (e.g., the memory block 103 in FIG. 1). For the 3D memory devices with multiple decks shown in FIGS. 4 and 5, all the memory cells in the top deck 452 and bottom deck 450 can be erased simultaneously. For example, during a time period $t_{erase}$, all the memory cells 340 of the memory string 212 in the 3D memory device 500 (in FIG. 5), including in the top deck 452 and in the bottom deck 450, can be reset to the erased state. The erase operation 600 includes applying an erase voltage $V_{erase}$ at the ACS 464 and/or the bit line 341 at $t_0$. Simultaneously, a hold-release voltage Via-re can be applied to the control gates 333 (including the control gates 333-1 in the bottom deck 450 and the control gates 333-2 in the top deck 452). In some embodiments, the erase voltage $V_{erase}$ can be in a range between about 15 V to about 25V. In some embodiments, the erase voltage $V_{erase}$ can be about 20 V. When applying the hold-release voltage $V_{hld-re}$ on an electrode, a voltage of 0 V is applied followed by release of the voltage of 0 V. In the other words, the electrode applied with the hold-release voltage $V_{hld-re}$, is biased at the voltage of 0 V first (e.g. at to) and then the external bias is removed and the electrode is released to floating (e.g., at $t_1$, where $t_1 > t_0$) where potential of the electrode can be changed by electromagnetic fields or charge accumulation within the conductor.

After initially applying the hold-release voltage $V_{hld-re}$, unselected word lines (i.e., control gates of erase-inhibited memory cells) can be kept floating after $t_1$, where potential of the unselected word lines can rise to a voltage $V_H$ at $t_3$ ($t_3 > t_2 > t_1 > t_0$) through capacitive coupling. In some embodiments, the voltage $V_H$ can have a magnitude close to the erase voltage $V_{erase}$.

For selected word lines (i.e., control gates of memory cells to be erased), a low voltage $V_L$ can be applied at $t_2$ ($t_2 > t_1 > t_0$), where potential of the selected word lines can reach the low voltage $V_L$ at $t_3$. In some embodiments, the low voltage $V_L$ can be any voltage less than about 1 V. In some embodiments, the low voltage $V_L$ can be 0 V. In this example, a voltage difference between the selected word line and the ACS 464 is $V_L - V_{erase}$, which can be high enough to remove the stored charges in the memory cells and reset the memory cells to the erased state.

In some embodiments, during the erase operation, the bit lines 341 and the top select gates (TSGs) 334 can be floating, i.e., not applied with any voltage. In this example, the bit line 341 and the top select transistor 334-T can be coupled to a high electric potential due to parasitic capacitances between the bit line 341 and the ACS 464. In the meantime, after applying the erase voltage $V_{erase}$ on the ACS 464, the electric potential of the channel of the memory cells 340 increases accordingly. Charge carriers (e.g., holes) in the doped source line region 344 (see FIG. 4) can be injected into the channel layer 338. Because the mobility of holes in the channel layer can be low in the channel layer 338 made of polycrystalline silicon or amorphous silicon, the electric potential of the channel of the memory cell 340 rises gradually from the bottom to the top of the channel. Accordingly, the electric potential of the channel layer 338 in the memory string 212 rises from bottom (i.e. the doped source line region 344 in FIG. 4 or the ACS 464 in FIG. 5) to the top (close to the bit line 341) gradually.

In some embodiments, after the erase operation, a distribution of the threshold voltages $V_{th}$ of the memory cells 340 can be verified, during an erase verification operation, by measuring the current flowing through the memory cells 340. For example, a verifying voltage $V_1$ (e.g., 0 V) can be applied to the control gates 333. For the memory cell with the threshold voltage $V_{th}$ lower than the verifying voltage $V_1$, the corresponding memory cell can be switched on and form a conductive path. If the threshold voltage $V_{th}$ of the memory cell is higher than the verifying voltage $V_1$, the corresponding memory cell is switched off. If not all the memory cells have threshold voltages less than the verifying voltage $V_1$, a higher voltage can then be applied by adding a step voltage $V_{step}$ to again verify the erased state. The above verification steps can be repeated until the threshold voltages of all the memory cells are verified. For the memory cells having the threshold voltages higher than a target erase-verify voltage $V_{target}$ after the erase operation, the memory cells are considered as erase fail. In some embodiments, the distribution of the threshold voltages $V_{th}$ of the memory cells 340 can be in a range between about −4.0 V to about −2.0 V after an erase operation, and the target erase-verify voltage $V_{target}$ can be in a range between about −2.0V to about −1.0V.

In a NAND flash memory, the memory cells can be reset to the erased states in an entire memory block which can be as large as hundreds of kilobytes (KB) or even megabytes (MB) in size, and the erase operation can take hundreds of microseconds to complete, much longer than a random access time for read or write. Thus, it is desirable to reduce the memory block size for a faster erase operation. Without scarifying storage capacity, the erase operation can be performed based on a sub-block, for example, for a selected deck in a 3D memory device with multiple decks.

Figure 7:
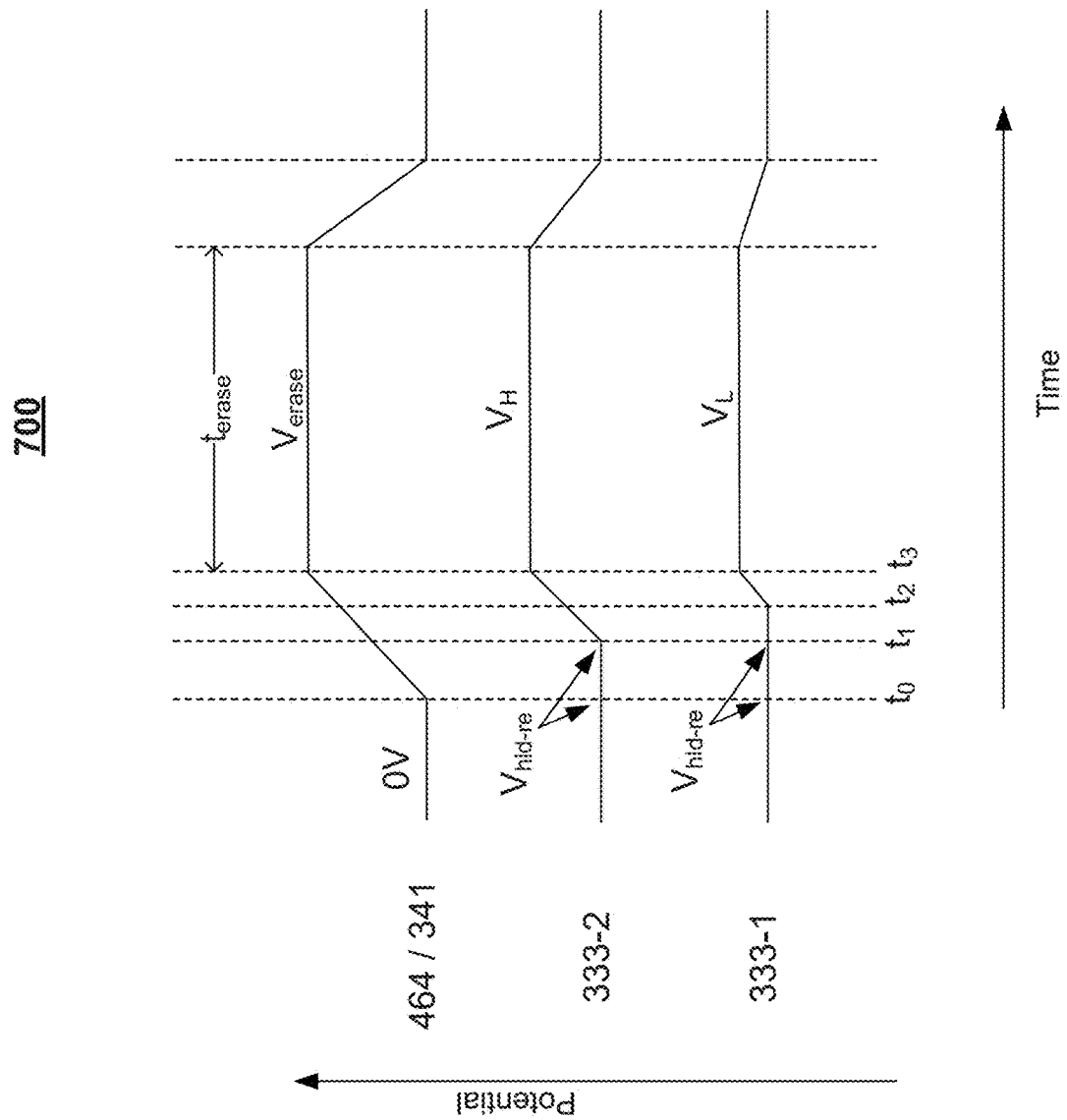

FIG. 7 shows a wave form for an erase operation 700, according to some embodiments of the present disclosure. In this example, for the 3D memory device 500 in FIG. 5, the erase operation 700 can be performed during the time period $t_{erase}$ for the memory cells 340-1 in the bottom deck 450, while the memory cells 340-2 in the top deck 452 can be inhibited from being erased, i.e., the data stored in the memory cells 340-2 in the top deck 452 remain after the erase operation. In this example, selected word lines, e.g., the control gates 333-1 of the bottom deck 450 can be applied with the hold-release voltage $V_{hld-re}$ at $t_0/t_1$, and the low voltage $V_L$ at $t_2$ ($t_2>t_1>t_0$). Similar to the erase operation 600, the ACS 464 and/or the bit lines 341 can be applied with the erase voltage $V_{erase}$. As a result, a negative voltage difference can be established between the control gates 333-1 in the bottom deck 450 and the source terminals of the memory cells 340-1 in the bottom deck 450. At the end of the time period tense, the memory cells 340-1 in the bottom deck 450 can be reset to the erased state. In this example, unselected word lines, e.g., the control gates 333-2 in the top deck 452, can be applied with the hold-release voltage $V_{hld-re}$ at $t_0/t_1$ and kept floating after $t_1$ (i.e., not applied with any external voltage). Potential of the control gates 333-2 in the top deck 452 can rise to the voltage $V_H$ through capacitive coupling.

Figure 8:
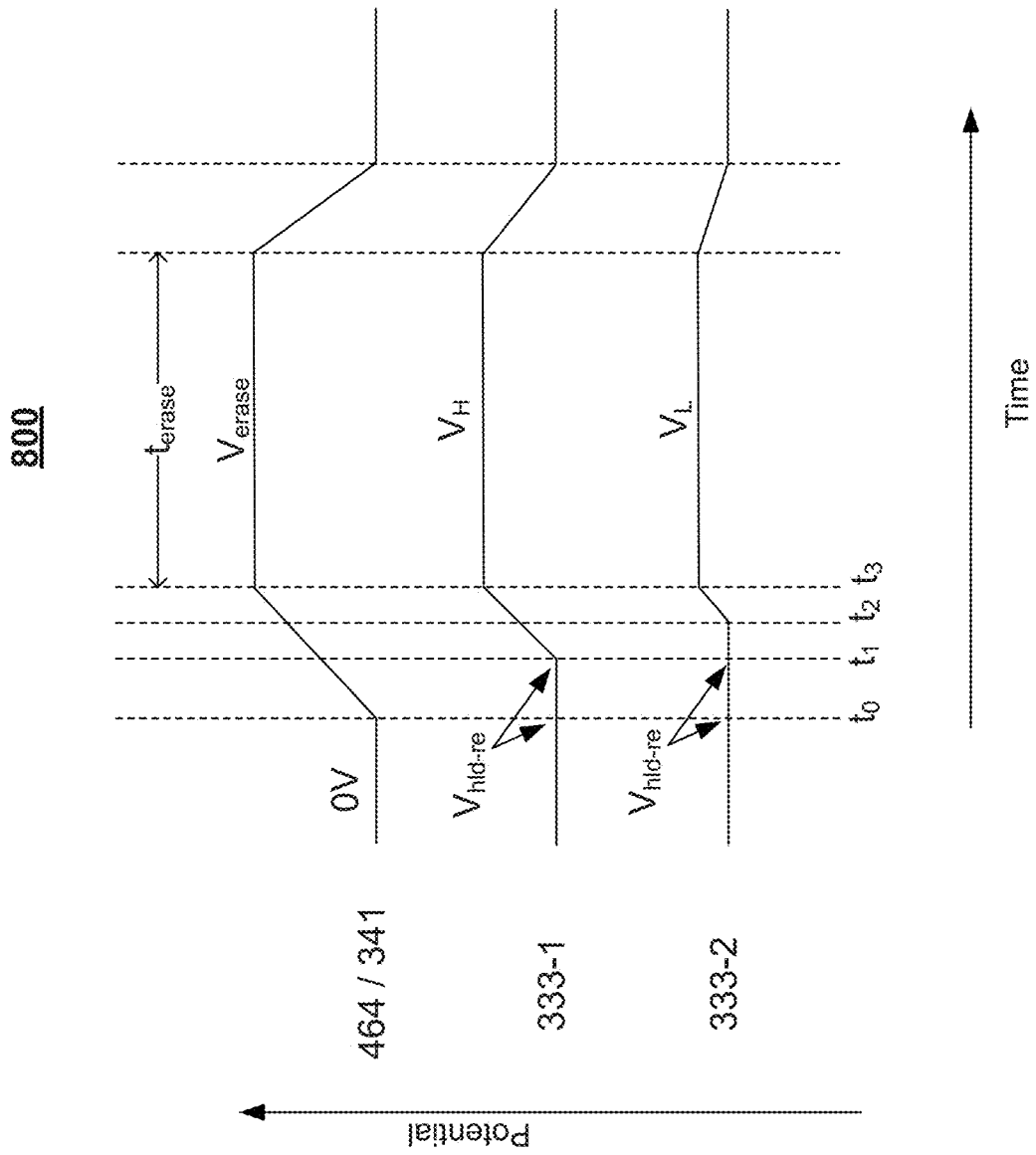

FIG. 8 shows a wave form for an erase operation 800, according to some embodiments of the present disclosure. In this example, the erase operation 800 can be performed for the memory cells 340-2 in the top deck 452, where the selected word lines, e.g., the control gates 333-2 in the top deck 452 can be applied with the hold-release voltage $V_{hld-re}$ at $t_0/t_1$, and the low voltage $V_L$ at $t_2$. Similar to the erase operation 600, the ACS 464 and/or the bit lines 341 can be applied with the erase voltage $V_{erase}$. As a result, a negative voltage difference can be established between the control gates 333-2 in the top deck 452 and the source terminals of the memory cells 340-2 in the top deck 452. At the end of the time period $t_{erase}$, the memory cells 340-2 in the top deck 452 can be reset to the erased state. In this example, unselected word lines, e.g., the control gates 333-1 in the bottom deck 450 can be applied with the hold-release voltage $V_{hld-re}$ at $t_0/t_1$ and kept floating after $t_1$, i.e., not applied with any external voltage. Potential of the control gates 333-1 in the bottom deck 450 can rise to the voltage $V_H$ through capacitive coupling. In some embodiments, the voltage $V_H$ can have a magnitude close to the erase voltage $V_{erase}$, where the voltage difference between the control gate 333-1 and the source terminals of the memory cells 340-1 can be very small. Accordingly, the memory cells 340-1 in the bottom deck 450 can be inhibited from being erased, i.e., the data stored in the memory cells 340-1 in the bottom deck 450 remain after the erase operation.

However, in the example shown in FIG. 8, the states and data pattern of the memory cells 340-1 in the bottom deck 450 during the erase operation 800 can impact the erased state threshold voltages $V_{th\_erase}$ of the memory cells 340-1 in the top deck 452. As discussed previously, after the erase voltage $V_{erase}$ is applied on the ACS 464, the charge carriers (e.g., holes) are injected to the channels of the memory cells 340 from bottom to the top, and electric potential of the channels rises gradually from bottom to top. However, the state or data pattern of the memory cells 340-1 in the bottom deck affect the electric potential of the corresponding memory cells 340-1, and thereby affect the transport of the charge carriers from the ACS 464 (or the doped source line region 344 in FIG. 4) to the bit line 341. As a result, the electric potential at the conductive plug 460 in FIG. 5 can be lower than the erase voltage $V_{erase}$ applied on the ACS 464. When the electric potential of the memory cells 340-2 in the top deck 452 is significantly lowered from the erase voltage $V_{erase}$, the voltage difference between the control gates 333-2 and the channel of the memory cells 340-2 may not be high enough to reset the correspond memory cell 340-2 to the erased state with desirable threshold voltage, i.e., the erased state threshold voltage $V_{th\_erase}$ below the target erase-verify voltage $V_{target}$. When the erased state threshold voltages $V_{th\_erase}$ of the memory cells 340-1 in the top deck 452 shift to a higher value, more memory cells having the erased state threshold voltages $V_{th\_erase}$ higher than the target erase-verify voltage $V_{target}$ and thereby more memory cells have erase fail.

Therefore, in some embodiments of the present disclosure, before performing an erase operation, preparation steps are added. During the preparation steps, the state and/or data pattern of neighboring decks can be checked and the memory cells of the neighboring decks can be addressed accordingly to facilitate the charge carriers transport from the ACS 464 (or the doped source line region 344 in FIG. 4) to the bit line 341 and thereby reduce the number of erase fails.

Figure 9:
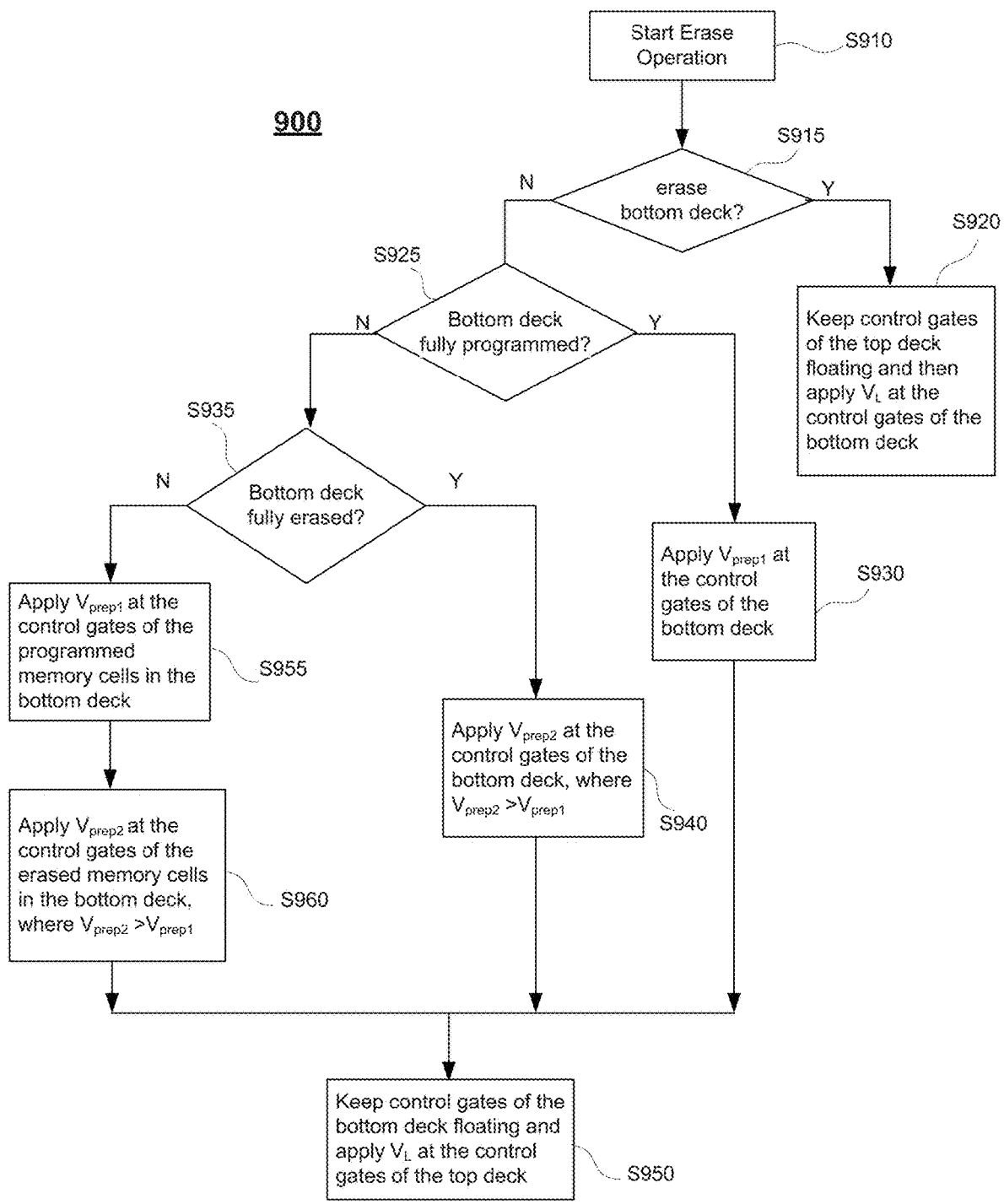
FIG. 9 illustrates a flow diagram of an erase method for a 3D memory device with multiple decks, according to some embodiments of the present disclosure.

FIG. 9 illustrates a flow diagram of an erase method 900 for the 3D memory device 500 in FIG. 5, according to some embodiments of the present disclosure. It should be understood that the erase method 900 are not exhaustive and that other operation steps can be performed as well before, after, or between any of the illustrated operation steps. In some embodiments, some operation steps of exemplary erase method 900 can be omitted or other operation steps can be included, which are not described here for simplicity. In some embodiments, operation steps of erase method 900 can be performed in a different order and/or vary.

According to some embodiments of this disclosure, the erase method 900 can be implemented for the 3D memory device 500 with the top deck 452 and the bottom deck 450 shown in FIG. 5. However, the method provided here can be extended to any 3D memory device with multiple decks stacked vertically, where the erase method can be performed for a selected deck. The bias conditions are similar to the ones discussed previously through FIGS. 6-8, where the differences are discussed below.

In the example of erase method 900, the erase voltage $V_{erase}$ is applied at the ACS 464. In some embodiments, the erase voltage $V_{erase}$ can be applied at the bit line 341 and the discussion below regarding to the top and bottom decks can be then applied to the bottom and top decks, respectively. In some embodiments, the erase voltage $V_{erase}$ can be applied at the ACS 464 and the bit line 341, where the discussion below regarding to the top and bottom decks can be extended to any selected deck and unselected deck.

The erase method 900 for the 3D memory device 500 starts at operation step S910.

At operation step S915, it is evaluated if a target memory deck to be erased is the bottom deck 450.

If the memory cells 340-1 of the bottom deck 450 are to be erased, then at operation step S920, the erase voltage $V_{erase}$ can be applied to the array common source (ACS) 464 at to and the hold-release voltage $V_{hld-re}$ can be applied to the control gates 333 at $t_0/t_1$ ($t_1>t_0$), where 0 V can be applied at to and then removed at $t_1$. The control gates 333-2 of the top deck 452 (i.e., unselected word lines in this example) can be kept floating after $t_1$ (i.e., without applying any external voltages). The control gates 333-1 of the bottom deck 450 (i.e., selected word lines in this example) can be applied with the low voltage $V_L$ at $t_2$ ($t_2>t_1>t_0$). The details have been discussed previously along with FIG. 7. Because the target memory deck is the bottom deck 450, close to the ACS 464, the charge carriers can be injected from the ACS 464 (or the doped source line region 344 in FIG. 4) to the channel of the memory cells 340-1 without being affected by the states or data pattern from the top deck 452. Therefore, the electric channel potential of the memory cells 340-1 can rise following the erase voltage $V_{erase}$ at the ACS 464 without being affected by the states or data pattern from the top deck 452. As a result, the erased state of the memory cells 340-1 in the bottom deck 450 can achieve a target erase fail rate.

If at operation step S915, it is determined that the target memory deck to be erased is not the bottom deck 450, but the top deck 452, then it is further checked at operation step S925 states and/or data pattern of the memory cells 340-1 in the bottom deck 450.

In some embodiments, if the bottom deck 450 is fully programed, i.e., all the memory cells 340-1 in the bottom deck 450 are at programmed states, then operation step S930 will be performed. In some embodiments, the programmed states include logic state "0" with a higher threshold voltage (e.g., a programmed threshold voltage $V_{th\_program}$) than the erased state threshold voltage $V_{th\_erase}$. In some embodiments, using multi-level-cell or triple-level-cell technology, each memory cell 340-1 can have multiple programed states, i.e., multiple values of threshold voltages $V_{th}$. In the other words, each memory cell 340-1 can store multiple bits, leading to significant increase of storage capacity.

Figure 10:
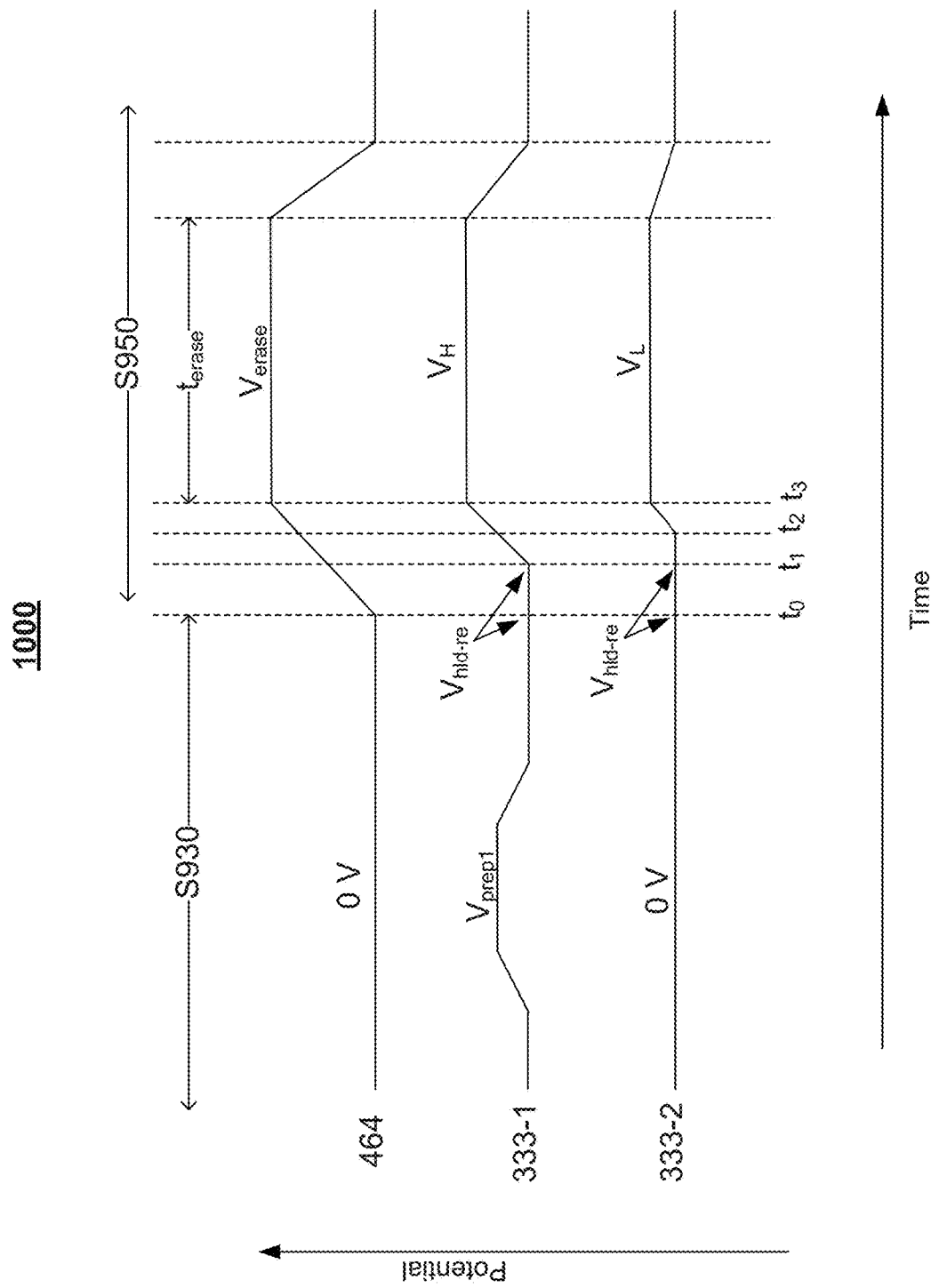
FIGS. 10-11 illustrate wave form diagrams of erase operations for 3D memory devices with multiple decks, according to some embodiments of the present disclosure.

At operation step S930, a first preparation voltage $V_{prep1}$ can be applied at the control gates 333-1 of the memory cells 340-1 in the bottom deck 450, while the ACS 464 can be grounded. The wave form of operation step S930 is shown in FIG. 10. In some embodiments, the first preparation voltage $V_{prep1}$ can be selected such that the memory cells 340-1 can be switched to accumulation mode, where charge carriers (e.g., holes) can be accumulated in the channel. To avoid disturb the stored data in the memory cells 340-1, the first preparation voltage $V_{prep1}$ can be kept low. In some embodiments, the first preparation voltage $V_{prep1}$ can be in a range between about 0 V to about 1.0 V. In some embodiments, the first preparation voltage $V_{prep1}$ can be 0 V.

Next, at operation step S950, the first preparation voltage $V_{prep1}$ applied on the control gates 333-1 of the memory cells 340-1 in the bottom deck 450 can be removed and the control gates 333-1 can be applied with the hold-release voltage $V_{hld-re}$ first and then kept floating, i.e., without external voltage applied. Accordingly, the memory cells 340-1 can be inhibited from being erased similar to the previous discussion with reference to FIG. 8. In the meantime, the low voltage $V_L$ can be applied to the control gates 333-2 of the top deck 452 after the hold-release voltage $V_{hld-re}$. Because charge carriers (e.g., holes) are accumulated in the channels of the memory cells 340-1 in the bottom deck 450, the charge carriers (e.g., holes) injected from the ACS 464 (or the doped source line region 344 in FIG. 4) to the memory cells 340-1 can be easily transported upwards. Thus, the electric potential of the channel of the memory cells 340-1 can rise to the erase voltage $V_{erase}$ applied on the ACS 464. Accordingly, the electric potential at the conductive plug 460 can be set close to the erase voltage $V_{erase}$, which enables the erase operation to be performed on the memory cells 340-2 in the top deck 452, effectively not depending on the states or data pattern of the bottom deck 450. As a result, the erased state of the memory cells 340-2 in the top deck 452 can achieve a target erase fail rate.

If at operation step S925, it is determined that the bottom deck is not fully programmed (not all the memory cells 340-1 are at the programmed states), it can be further checked at operation step S935 whether the bottom deck is fully erased, i.e. whether all the memory cells 340-1 are at the erased states.

Figure 11:
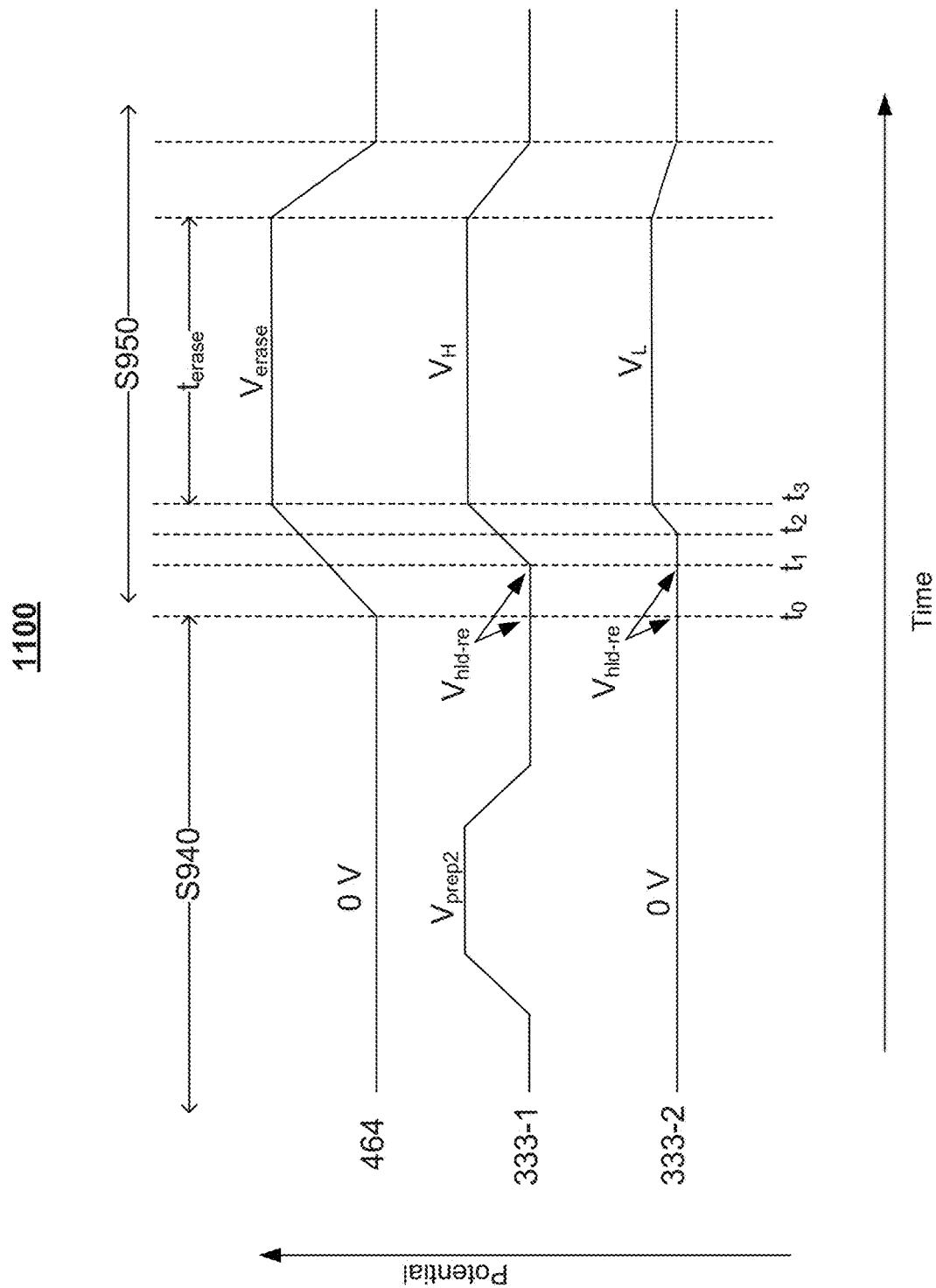

If it is determined at operation step S935 that all the memory cells 340-1 in the bottom deck 450 are at the erased states, operation step S940 can be performed where a second preparation voltage $V_{prep2}$ can be applied at the control gates 333-1 of the memory cells 340-1 in the bottom deck 450. The wave form of the operation step S940 is shown in FIG. 11. In some embodiments, the second preparation voltage $V_{prep2}$ can be higher than the first preparation voltage $V_{prep1}$. In some embodiments, the second preparation voltage $V_{prep2}$ can be in a range between about 1.0 V to about 7.0 V. In some embodiments, the second preparation voltage $V_{prep2}$ can be about 1.0 V. The erase method 900 can then be continued following operation step S950 described previously. In some embodiments, the second preparation voltage $V_{prep2}$ can be high enough to write dummy data patterns into the memory cells 340-1, i.e., set the memory cells 340-1 to the programmed states. In some embodiments, the dummy data patterns can be programmed to all the memory cells 340-1 in the bottom deck. In some embodiments, every the other memory cells 340-1 in the bottom deck can be programmed with the dummy data patterns by applying the second preparation voltage $V_{prep2}$ to the corresponding control gates 333-1. In some embodiments, the dummy data patterns can be programmed to a subset of memory cells 340-1 in the bottom deck.

If at the operations step S935, it is determined that the bottom deck 450 is not fully erased, the bottom deck 450 is partially programmed and partially erased. In this example, some memory cells 340-1 are at the erased states and some memory cells 340-1 are at the programmed states. At operation step S955, the first preparation voltage $V_{prep1}$ can be applied to those memory cells 340-1 that are at the programmed states and the second preparation voltage $V_{prep2}$ can be applied to those memory cells 340-1 that are at erased states at operation step S960. The erase method 900 can then be continued following operation step S950 described previously.

In some embodiments, the operation step S955 and operation step S960 are performed when two neighboring memory cells 340-1 in the bottom decks are both at the erased states.

In case that data pattern recognition in the bottom deck 450 cause significant delay, in some embodiments, the first preparation voltage $V_{prep1}$ and the second preparation voltage $V_{prep2}$ can be randomly applied to the control gates 333-1 in the bottom deck 450.

By preparing the memory cells 340-1 in the bottom deck 450 according to the states and data pattern, the electric potential at the conductive plug 460 can rise close to the erase voltage $V_{erase}$ applied at the ACS 464. Therefore, the memory cells 340-2 in the top deck 452 can be erased similarly to the memory cells in the bottom deck 450 or a 3D memory device with a single deck and the erase fail rate in the top deck 452 can be reduced.

The methods described herein can also be implemented in a 3D memory device with multiple decks (more than two decks), where middle decks and top decks can have similar erase fails as discussed above. By adding preparation operations, the electric potentials at a source end of the middle deck or top deck (e.g., conductive plugs 460) can be controlled to the erase voltage $V_{erase}$ applied at the array common source in the substrate. For example, when a top deck is vertically stacked on a middle deck and the middle deck is vertically stacked on a bottom deck over a substrate, the top, middle and bottom decks can be erased selectively. To improve erase yield for the middle deck, the operation steps S940, S955 and/or S960 can be implemented on the top and bottom decks before the erasing the middle deck. In this example, at operation step S950, the hold-release voltage can be applied on unselected word lines of the top deck and the bottom deck, and the low voltage $V_L$ can be applied on selected word lines of the middle deck.

Similarly, the methods described herein can also be implemented in a 3D memory device with multiple decks, where the erase voltage $V_{erase}$ can be applied at the ACS 464 and/or the bit line 341. In this example, the bottom deck, middle deck or top deck can have erase fails depending on the distance between the corresponding deck and the ACS 464 and/or the bit line 341. By adding similar preparation operations discussed above, the electric potentials at a source and/or drain end of the corresponding deck can be controlled to the erase voltage $V_{erase}$. Thus, sufficient voltage difference can be maintained between selected word lines (i.e., control gates of target memory cells) and channels of the target memory cells. The corresponding deck (i.e., selected sub-block) can therefore be erased successfully.

In summary, the present disclosure provides erasing methods for a three-dimensional (3D) memory device. The 3D memory device includes multiple decks vertically stacked over a substrate, wherein each deck includes a plurality of memory cells. The erasing method includes checking states of the plurality of memory cells of an erase-inhibit deck and preparing the erase-inhibit deck according to the states of the plurality of memory cells. The erasing method also includes applying an erase voltage at an array common source, applying a hold-release voltage on unselected word lines of the erase-inhibit deck, and applying a low voltage on selected word lines of a target deck.

The present disclosure also provides a three-dimensional (3D) memory device having multiple decks vertically stacked over a substrate. Each deck includes a film stack of alternating conductive and dielectric layers, and a plurality of memory strings penetrating through the film stack, where each memory string includes a plurality of memory cells. The 3D memory device also includes a conductive plug disposed between adjacent decks, electrically connecting the plurality of memory strings between the adjacent decks. The multiple decks of the 3D memory device includes a target deck and an erase-inhibit deck. The 3D memory device is configured to erase the target deck by the following steps: checking states of the plurality of memory cells of the erase-inhibit deck, preparing the erase-inhibit deck according to the states of the plurality of memory cells of the erase-inhibit deck, applying an erase voltage at an array common source, applying a hold-release voltage on unselected word lines of the erase-inhibit deck, and applying a low voltage on selected word lines of the target deck.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. An erasing method for a three-dimensional (3D) memory device comprising multiple decks vertically stacked over a substrate, wherein each deck comprises a plurality of memory cells, the erasing method comprising:
    checking states of the plurality of memory cells of an erase-inhibit deck;
    preparing the erase-inhibit deck according to the states of the plurality of memory cells;
    applying an erase voltage at an array common source or an array cell well-body;
    applying a hold-release voltage on unselected word lines of the erase-inhibit deck; and
    applying a low voltage on selected word lines of a target deck, wherein the low voltage is less than the erase voltage.

2. The erasing method of claim 1, wherein the preparing the erase-inhibit deck comprises:
    applying a first preparation voltage on the unselected word lines of the erase-inhibit deck when the plurality of memory cells of the erase-inhibit deck are in programmed states.

3. The erasing method of claim 2, wherein the applying the first preparation voltage comprises applying a voltage between about 0 V and about 1 V.

4. The erasing method of claim 3, wherein the applying the first preparation voltage comprises applying 0 V.

5. The erasing method of claim 2, wherein the preparing the erase-inhibit deck comprises:
    applying a second preparation voltage on the unselected word lines of the erase-inhibit deck when the plurality of memory cells of the erase-inhibit deck are in erased states, wherein the second preparation voltage is larger than the first preparation voltage.

6. The erasing method of claim 5, wherein the applying the second preparation voltage comprises applying a voltage between about 1 V and about 7 V.

7. The erasing method of claim 1, wherein the preparing the erase-inhibit deck comprises:
    applying a first preparation voltage on a first subset of the unselected word lines of the erase-inhibit deck when a first subset of the plurality of memory cells comprising the first subset of the unselected word lines are in programmed states; and
    applying a second preparation voltage on a second subset of the unselected word lines of the erase-inhibit deck when a second subset of the plurality of memory cells comprising the second subset of the unselected word lines are in erased states, wherein the second preparation voltage is larger than the first preparation voltage.

8. The erasing method of claim 7, wherein the second subset of the plurality of memory cells comprises at least two neighboring memory cells.

9. The erasing method of claim 1, wherein the preparing the erase-inhibit deck comprises:
applying a first preparation voltage and a second preparation voltage that is larger than the first preparation voltage, on the unselected word lines of the erase-inhibit deck randomly, when a first subset of the plurality of memory cells in the erase-inhibit deck are in programmed states and a second subset of the plurality of memory cells in the erase-inhibit deck are in erased states.

10. The erasing method of claim 1, wherein the applying the low voltage comprises applying a voltage in a range between about 0 V and about 1 V.

11. The erasing method of claim 10, wherein the applying the low voltage comprises applying a voltage of 0 V.

12. The erasing method of claim 1, wherein the applying the hold-release voltage comprises:
applying a voltage of 0 V; and
subsequently removing the voltage of 0 V and any external bias.

13. The erasing method of claim 1, wherein the applying the erase voltage comprises applying a voltage in a range between about 15 V to about 25 V.

14. The erasing method of claim 1, wherein the applying the erase voltage comprises applying about 20 V.

15. The erasing method of claim 1, further comprising:
applying the erase voltage at bit lines of the target deck.

16. The erasing method of claim 1, further comprising:
prior to applying the low voltage on the selected word lines of the target deck, applying the hold-release voltage on the selected word lines of the target deck.

17. The erasing method of claim 1, further comprising:
applying the hold-release voltage on unselected word lines of a bottom deck; and
applying the low voltage on selected word lines of a top deck, wherein the top deck is vertically stacked on the bottom deck over the substrate.

18. The erasing method of claim 1, further comprising:
applying the hold-release voltage on unselected word lines of a top deck and a bottom deck; and
applying the low voltage on selected word lines of a middle deck, wherein the top deck is vertically stacked on the middle deck and the middle deck is vertically stacked on the bottom deck over the substrate.

19. The erasing method of claim 18, further comprising:
applying the erase voltage at bit lines of the top deck.

20. A three-dimensional (3D) memory device, comprising:
multiple decks vertically stacked over a substrate, wherein each deck comprises
a film stack of alternating conductive and dielectric layers; and
a plurality of memory strings penetrating through the film stack, each memory string comprising a plurality of memory cells; and
a conductive plug disposed between adjacent decks, electrically connecting the plurality of memory strings between the adjacent decks,
wherein the multiple decks comprise a target deck and an erase-inhibit deck, and the 3D memory device is configured to erase the target deck by:
checking states of the plurality of memory cells of the erase-inhibit deck;
preparing the erase-inhibit deck according to the states of the plurality of memory cells of the erase-inhibit deck;
applying an erase voltage at an array common source or an array cell well-body;
applying a hold-release voltage on unselected word lines of the erase-inhibit deck; and
applying a low voltage on selected word lines of the target deck.

* * * * *